(12) United States Patent
Park

(10) Patent No.: US 10,971,655 B2
(45) Date of Patent: Apr. 6, 2021

(54) SEMICONDUCTOR DEVICE

(71) Applicant: LG INNOTEK CO., LTD., Seoul (KR)

(72) Inventor: Hyung Jo Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 380 days.

(21) Appl. No.: 16/086,221

(22) PCT Filed: Apr. 12, 2017

(86) PCT No.: PCT/KR2017/003965
§ 371 (c)(1),
(2) Date: Sep. 18, 2018

(87) PCT Pub. No.: WO2017/179908
PCT Pub. Date: Oct. 19, 2017

(65) Prior Publication Data
US 2020/0295230 A1 Sep. 17, 2020

(30) Foreign Application Priority Data

Apr. 12, 2016 (KR) .................. 10-2016-0044566

(51) Int. Cl.
*H01L 33/00* (2010.01)
*H01L 33/40* (2010.01)
(Continued)

(52) U.S. Cl.
CPC ...... *H01L 33/405* (2013.01); *H01L 31/02161* (2013.01); *H01L 31/02327* (2013.01);
(Continued)

(58) Field of Classification Search
CPC ....... H01L 31/02161; H01L 31/022408; H01L 31/02327; H01L 31/03044;
(Continued)

(56) References Cited

U.S. PATENT DOCUMENTS

2005/0161695 A1 7/2005 Wipiejewski
2005/0263787 A1 12/2005 Ishimura et al.
(Continued)

FOREIGN PATENT DOCUMENTS

| JP | 2005-340339 | 12/2005 |
| KR | 10-2011-0091375 | 8/2011 |
| WO | WO 2010/098221 | 9/2010 |

OTHER PUBLICATIONS

International Search Report (with English Translation) and Written Opinion dated Jul. 14, 2017 issued in Application No. PCT/KR2017/003965.

*Primary Examiner* — Brook Kebede
(74) *Attorney, Agent, or Firm* — Ked & Associates, LLP

(57) ABSTRACT

One embodiment provides a semiconductor device comprising: a substrate; a first semiconductor layer disposed on the substrate; a second semiconductor layer disposed on the first semiconductor layer; a third semiconductor layer disposed on the second semiconductor layer; and a reflective layer disposed on the third semiconductor layer, wherein the part between the first and second semiconductor layers, the part between the third and second semiconductor layers, and the second semiconductor layer comprise a depletion region, and the conductivity of the first semiconductor layer and the conductivity of the third semiconductor layer are different from each other, and the second semiconductor layer comprises an intrinsic semiconductor layer.

20 Claims, 2 Drawing Sheets

(51) Int. Cl.
*H01L 31/0216* (2014.01)
*H01L 31/0224* (2006.01)
*H01L 31/0232* (2014.01)
*H01L 31/0304* (2006.01)
*H01L 33/32* (2010.01)
*H01L 33/44* (2010.01)

(52) U.S. Cl.
CPC ........... *H01L 31/022408* (2013.01); *H01L 31/03044* (2013.01); *H01L 33/32* (2013.01); *H01L 33/44* (2013.01)

(58) Field of Classification Search
CPC ........... H01L 31/03048; H01L 31/0352; H01L 31/035236; H01L 31/105; H01L 31/109; H01L 33/002; H01L 33/0025; H01L 33/025; H01L 33/14; H01L 33/145; H01L 33/32; H01L 33/405
USPC .................................................. 257/94–102
See application file for complete search history.

(56) References Cited

U.S. PATENT DOCUMENTS

| | | | |
|---|---|---|---|
| 2009/0127581 A1* | 5/2009 | Ou | H01L 21/0262 257/103 |
| 2011/0193940 A1 | 8/2011 | Park et al. | |
| 2011/0266644 A1 | 11/2011 | Yamamura et al. | |
| 2015/0060908 A1* | 3/2015 | Jain | H01L 33/04 257/94 |
| 2016/0079464 A1 | 3/2016 | Sasaki et al. | |

* cited by examiner

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2017/003965, filed Apr. 12, 2017, which claims priority to Korean Patent Application No. 10-2016-0044566, filed Apr. 12, 2016, whose entire disclosures are hereby incorporated by reference.

TECHNICAL FIELD

Embodiments relate to a semiconductor device.

BACKGROUND ART

Semiconductor devices including compounds, such as GaN, AlGaN, etc., have many advantages, such as wide and easily adjustable bandgap energy, and are thus widely used in light emitting devices, light receiving devices, etc.

As light emitting devices, there are light emitting diodes or laser diodes which use group -IV or -V compound semiconductor materials. These light emitting devices are capable of emitting visible light of various colors, such as red, green and blue, and ultraviolet light owing to development of device materials and thin film growth techniques, are also capable of emitting white light with high luminous efficacy through use of phosphors or by combining colors, and have several advantages, namely low power consumption, semi-permanent lifespan, fast response speed, safety, and environmental friendliness, as compared to conventional light sources, such as fluorescent lamps and incandescent lamps. Accordingly, application of light emitting devices has been extended to transmission modules of optical communication means, light emitting diode backlights to replace Cold Cathode Fluorescent Lamps (CCFLs) which constitute backlights of Liquid Crystal Display (LCD) apparatuses, white light emitting diode lighting apparatuses to replace fluorescent lamps or incandescent lamps, vehicle head lamps, and traffic lights.

As one example of light receiving devices, a photodetector is a kind of transducer which detects light and converts an intensity thereof into an electrical signal. Light receiving devices using a semiconductor convert electromagnetic energy into electrical energy using the photoelectric effect generated by the semiconductor. Such light receiving devices may be implemented as various types.

Photons of light incident upon a light receiving device are absorbed by a depletion region and are then converted into an electrical signal, but photons of light which are not absorbed by the depletion region are transmitted through the depletion region and, thus, light conversion efficiency of the light receiving device may be lowered.

DISCLOSURE

Technical Problem

Embodiments provide a semiconductor device in which, among photons of light incident upon the semiconductor device, photons of light not absorbed by a depletion region but transmitted through the depletion region may be absorbed by the depletion through a reflective layer.

Technical Solution

In one embodiment, a semiconductor device includes a substrate, a first semiconductor layer disposed on the substrate, a second semiconductor layer disposed on the first semiconductor layer, a third semiconductor layer disposed on the second semiconductor layer and a reflective layer disposed on the third semiconductor layer, wherein a part between the first and second semiconductor layers, a part between the third and second semiconductor layers, and the second semiconductor layer form a depletion region.

A conductivity type of the first semiconductor layer and a conductivity type of the third semiconductor layer may be different from each other, and the second semiconductor layer may include an intrinsic semiconductor layer.

The first semiconductor layer may be an n-type, and the third semiconductor layer may be a p-type.

The first semiconductor layer may be a p-type, and the third semiconductor layer may be an n-type.

The semiconductor device may further include an ohmic layer disposed between the third semiconductor layer and the reflective layer.

The ohmic layer and the reflective layer may be integrally formed as a single layer.

The semiconductor device may further include a protective layer disposed on the reflective layer.

The reflective layer may be formed as a coated film type.

The semiconductor device may further include a plurality of fourth semiconductor layers disposed on the third semiconductor layer so as to be spaced apart from one another.

The fourth semiconductor layers may have the same conductivity type as that of the third semiconductor layer.

The reflective layer may be connected to the third semiconductor layer through spaces between the fourth semiconductor layers.

The semiconductor device may further include a second ohmic layer disposed on the fourth semiconductor layers.

The reflective layer may be disposed on the fourth semiconductor layers so as to cover the second ohmic layer 165.

The reflective layer may be formed of the same material as the second ohmic layer.

The reflective layer may be formed of a different material from the second ohmic layer.

The reflective layer may include at least one selected from the group consisting of aluminum (Al), rhodium (Rh), silver (Ag), nickel (Ni) and titanium (Ti), or an alloy thereof.

The ohmic layer may include one or more selected from the group consisting of rhodium (Rh), nickel (Ni), palladium (Pd), platinum (Pt), titanium (Ti), aluminum (Al) and chromium (Cr).

Advantageous Effects

Semiconductor devices in accordance with embodiments may have improved light conversion efficiency by increasing a quantity of light absorbed by a depletion region.

BEST MODE

Figure 1:
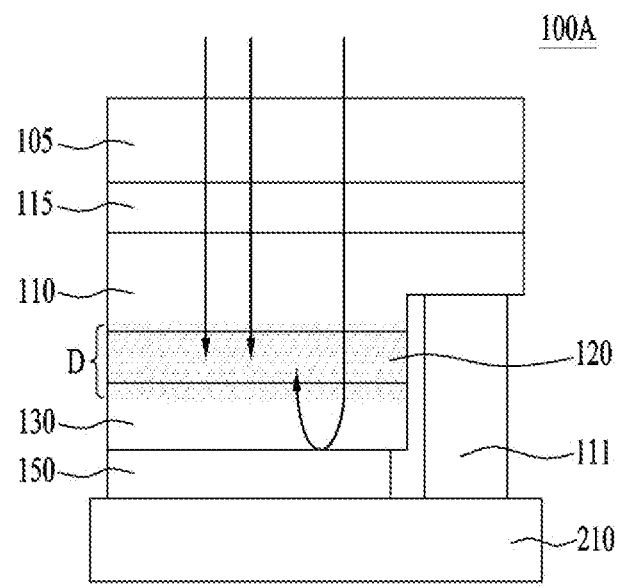
FIG. 1 is a view illustrating a semiconductor device in accordance with one embodiment.

Hereinafter, embodiments will be described in detail with reference to the annexed drawings and description. However, the embodiments set forth herein may be variously modified, and it should be understood that the embodiments are to cover all modifications, equivalents, and alternatives falling within the spirit and scope of the disclosure as defined by the claims. The embodiments are provided to more completely describe the disclosure to those skilled in the art.

In the following description of the embodiments, it will be understood that, when each element is referred to as being formed "on" or "under" another element, it can be directly "on" or "under" the other element or be indirectly formed with one or more intervening elements therebetween. Further, when an element is referred to as being formed "on" or "under" another element, not only the upward direction of the former element but also the downward direction of the former element may be included.

In addition, it will be understood that, although the relational terms "first", "second", "upper", "lower", etc. may be used herein to describe various elements, these terms neither require nor connote any physical or logical relations between substances or elements or the order thereof, and are used only to discriminate one substance or element from other substances or elements.

Semiconductor devices may include light emitting devices or light receiving devices, and both the light emitting devices and the light receiving devices may include a first conductivity-type semiconductor layer, an active layer and a second conductivity-type semiconductor layer.

First, a light emitting device emits light having energy determined by an inherent energy band of a material, as electrons injected through a first conductivity-type semiconductor layer and holes injected through a second conductivity-type semiconductor layer meet in an active layer. Here, the emitted light may be different according to composition of the material.

The light emitting device may be formed as a light emitting device package and thus be used as a light source of a lighting system, for example, a light source of an image display apparatus or a light source of a lighting apparatus.

When the light emitting device is used as a backlight unit of an image display apparatus, the light emitting device may be used as an edge type backlight unit or a direct type backlight unit, when the light emitting device is used as light source of a lighting apparatus, the light emitting device may be used as a lighting lamp or a bulb type, or the lighting emitting device may be used as a light source of a mobile terminal.

Light emitting devices may include laser diodes in addition to light emitting diodes. Light emitted by a light emitting device may include a combination of beams of various wavelengths, and the light may be emitted radially from the light emitting device. A laser diode may include a first conductivity-type semiconductor layer, an active layer and a second conductivity-type semiconductor layer of the above-described structure. Further, the laser diode uses electroluminescence in which, when the first conductivity-type semiconductor layer of a p-type and the second conductivity-type semiconductor layer of an n-type are bonded and then current is applied thereto, the active layer emits light, but is different from other light emitting devices in terms of directionality and a wavelength band of emitted light. That is, the laser diode may emit light having one specific wavelength, i.e., a monochromatic beam, in the same phase and the same direction using stimulated emission, constructive interference, etc., and thus be used in optical communication due to these characteristics.

Light receiving devices may mean photodetectors, i.e., transducers which detect light and convert an intensity thereof into an electrical signal. The photodetectors may include a photocell (silicon or selenium), a photoconductive device (cadmium sulfide or cadmium selenide), a photodiode (for example, a PD having a peak wavelength in a visible blind spectral region or a true blind spectral region), a phototransistor, a photomultiplier, a photoelectric tube (vacuum or gas sealing), an infrared (IR) detector, etc., without being limited thereto.

Further, semiconductor devices, such as photodetectors, may be generally manufactured using a direct bandgap semiconductor having excellent light conversion efficiency. The photodetectors may have various structures and thereamong, a pin-type photodetector using a p-n junction, a Schottky-type photodetector using a Schottky junction and a Metal Semiconductor Metal (MSM)-type photodetector are used as general structures. The pin-type photodetector and the Schottky-type photodetector may be implemented using a nitride semiconductor material.

The lighting receiving device, such as a photodiode, may include a first conductivity-type semiconductor layer, an active layer and a second conductivity-type semiconductor layer, in the same manner as the light emitting device, and have a p-n junction or pin structure. When reverse bias voltage is applied to the photodiode, resistance is greatly raised and thus micro current flows but, when light is incident upon the photodiode, electrons and holes are generated and thus current flows and, at this time, a magnitude of voltage is almost proportional to an intensity of light incident upon the photodiode.

A photo cell or a solar cell is a kind of photodiode, and may convert light into current using the photoelectric effect. The solar cell may include a first conductivity-type semiconductor layer, an active layer and a second conductivity-type semiconductor layer, in the same manner as the above-described structure of the light emitting device. When external sunlight is incident upon the solar call, electrons and holes are respectively generated by the first conductivity-type semiconductor layer of an n-type and the second conductivity-type semiconductor layer of a p-type, the generated electrons and holes are respectively moved to an n-type electrode and a p-type electrode and, when the n-type electrode and the p-type electrode are connected, and the electrons are moved from the n-type electrode to the p-type electrode and thus current flows.

Solar cells may be divided into crystalline solar cells and thin film solar cells, and the thin film solar cells may be divided into inorganic thin film-based solar cells and organic thin film-based solar cells.

Further, the above-described semiconductor devices are not always implemented using a semiconductor alone and may further include a metal material in some cases. For example, semiconductor devices, such as light receiving devices, may be implemented using at least one of Ag, Al, Au, In, Ga, N, Zn, Se or As, and be implemented using a semiconductor material doped with a p-type dopant or an n-type dopant or an intrinsic semiconductor material.

Here, a semiconductor device in accordance with one embodiment, performing functions of the above-described light receiving device, will be described.

FIG. 1 is a view illustrating a semiconductor device 100A in accordance with one embodiment.

With reference to FIG. 1, the semiconductor device 100A in accordance with this embodiment may include a substrate 105, a first semiconductor layer 110, a second semiconductor layer 120, a third semiconductor layer 130 and a reflective layer 150.

The substrate 105 may be an optically transparent substrate which may transmit light incident upon the semiconductor device 100A.

The substrate 105 may include a conductive material or a nonconductive material. For example, the substrate 105 may include at least one selected from the group consisting of sapphire (Al2O3), GaN, SiC, ZnO, GaP, InP, Ga2O3, GaAs and Si, but the disclosure is not limited to a specific material of the substrate 105.

Further, in order to improve a difference in coefficients of thermal expansion and lattice mismatch between the substrate 105 and a light receiving structure 110, 120 and 130, a buffer layer 115 may be further disposed between the substrate 105 and the first semiconductor layer 110.

The buffer layer 115 may be grown on the substrate 105 and be generally grown as an amorphous type, a polycrystalline type, or a combination thereof.

The buffer layer 115 may include, for example, at least one material selected from the group consisting of Al, In, N and Ga, without being limited thereto. Further, the buffer layer 115 may have a monolayer or multilayer structure. For example, the buffer layer 115 may be formed of AlN.

When the buffer layer 115 is formed, the first semiconductor layer 110 may be disposed on the buffer layer 115. The first semiconductor layer 110 may be a highly doped N-AlGaN semiconductor layer.

The second semiconductor layer 120 may be disposed under the first semiconductor layer 110, and the third semiconductor layer 130 may be disposed under the second semiconductor layer 120.

In the embodiment, a conductivity type of the first semiconductor layer 110 and a conductivity type of the third semiconductor layer 130 may be different from each other.

The first semiconductor layer 110 may be an n-type and the third semiconductor layer 130 may be a p-type. On the contrary, the first semiconductor layer 110 may be a p-type and the third semiconductor layer 130 may be an n-type.

For example, the first semiconductor layer 110 may be a first conductivity-type semiconductor layer doped with a first conductivity-type dopant, and the third semiconductor layer 130 may be a second conductivity-type semiconductor layer doped with a second conductivity-type dopant. Otherwise, the first semiconductor layer 110 may be a second conductivity-type semiconductor layer and the third semiconductor layer 130 may be a first conductivity-type semiconductor layer.

The first conductivity-type dopant may be an n-type dopant and include Si, Ge, Sn, Se, Te, etc., without being limited thereto. Further, the second conductivity-type dopant may be a p-type dopant and include Mg, Zn, Ca, Sr, Ba, etc., without being limited thereto.

The second semiconductor layer 120 may be disposed between the first semiconductor layer 110 and the third semiconductor layer 130, and the second semiconductor layer 120 may include an intrinsic semiconductor layer.

The second semiconductor layer 120 may be an undoped (unintentionally doped) semiconductor layer. The undoped semiconductor layer is a semiconductor layer in which deficiency of sodium (N), i.e., N-vacancies, may occur even in a region to which a dopant, for example, an n-type dopant, is not supplied during a growth process of the semiconductor layer and, when the N-vacancies are increased, a concentration of surplus electrons is increased so that the semiconductor layer may have similar characteristics to a semiconductor layer doped with an n-type dopant even if it is unintended during a manufacturing process thereof.

The second semiconductor layer 120 is an undoped pure AlGaN compound semiconductor layer and may adjust a wavelength region of received light according to an Al content thereof. The second semiconductor layer 120 may be AlyGa1-yN layer.

When the Al content of the second semiconductor layer 120 is high, an energy bandgap is increased and thus light of a shorter wavelength may be received. For example, when the undoped second semiconductor layer absorbs light having a wavelength of 280 nm, a flip-chip type semiconductor device may be used in an ultraviolet detector. When the Al content is considerably raised, the semiconductor device may be used as a detector of light of an extreme ultraviolet region. Therefore, the second semiconductor layer 120 may absorb light having a wavelength of 250 nm to 360 nm according to the Al content thereof.

The second semiconductor layer 120 may be formed to have a designated thickness and, if the thickness of the second semiconductor layer 120 is excessively large, light may not reach a depletion region and thus light receiving efficiency may be lowered and, therefore, the semiconductor layer 120 may be formed to have a thickness through which light may reach the depletion region.

An ohmic layer (not shown) may be disposed on the third semiconductor layer 130. The ohmic layer (not shown) may be a Transparent Conductive Oxide (TCO) film. For example, the ohmic layer (not shown) may include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al-Ga ZnO (AGZO), In-Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf, without being limited thereto.

Here, if a second electrode disposed on the third semiconductor layer 130 includes a material forming ohmic contact, the ohmic layer forming ohmic contact may be omitted.

In the semiconductor device 100A in accordance with the embodiment, a depletion region is formed between the first semiconductor layer 110 and the second semiconductor layer 120, between the third semiconductor layer 130 and the second semiconductor layer 120 and in the second semiconductor layer 120.

The depletion region D serves to absorb photons of light incident upon the semiconductor device 100A from the outside.

Photons of light incident from the substrate 105 of the semiconductor device 100A are absorbed by the depletion region and thus the absorbed light is converted into an electrical signal, and, in a conventional semiconductor device, some of photons of light incident upon the semiconductor device through a substrate are absorbed by a depletion region but some of the photons are not absorbed by the depletion region and are transmitted through the depletion region and, thus, light loss occurs and light conversion efficiency of the conventional semiconductor device is lowered.

In this embodiment, the reflective layer 150 may be disposed under the third semiconductor layer 130 so that light not absorbed by the depletion region and transmitted through the depletion region may be reflected to the depletion region.

The reflective layer 150 and a first electrode 111 may be respectively disposed on a submount 210. The submount 210 may be a semiconductor substrate formed of AlN, BN, silicon carbide (SiC), GaN, GaAs or Si, without being limited thereto, and be formed of a semiconductor material having excellent thermal conductivity.

The first electrode 111 may be formed of metal, i.e., one selected from the group consisting of Ag, Ni, Ti, Al, Rh, Pd, Ir, Ru, Mg, Zn, Pt, Au, Hf, Cr and selective combinations thereof, and be formed to have a monolayer or multilayer structure.

The semiconductor device 100A shown in FIG. 1 has a flip-chip bonding structure, and a semiconductor device 100B shown in FIG. 2, which will be described later, has a horizontal bonding structure.

Figure 2:
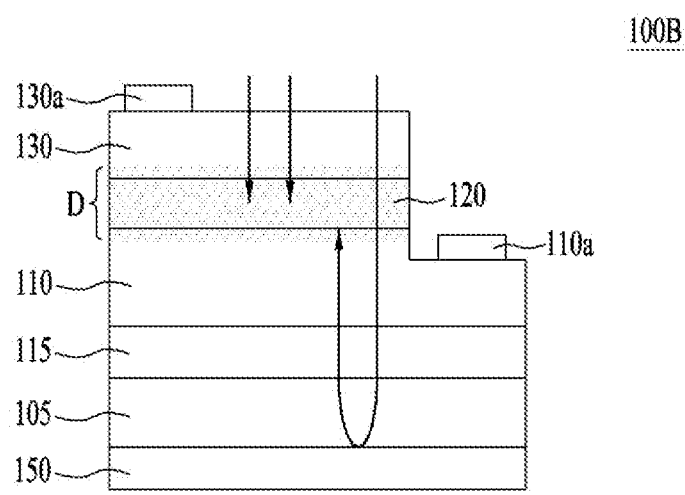
FIG. 2 is a view illustrating a semiconductor device in accordance with another embodiment.

FIG. 2 is a view illustrating the semiconductor device 100B in accordance with another embodiment.

With reference to FIG. 2, the semiconductor device 100B may include a substrate 105, a buffer layer 115, a first semiconductor layer 110, a second semiconductor layer 120, a third semiconductor layer 130 and a reflective layer 150.

The first semiconductor layer 110, the second semiconductor layer 120 and the third semiconductor layer 130 shown in FIG. 2 are the same as the first semiconductor layer, the second semiconductor layer and the third semiconductor layer shown in FIG. 1 and a detailed description thereof will thus be omitted.

A first electrode 110a may be disposed on the first semiconductor layer 110. For example, the first electrode 112 may be formed on an exposed portion of the first semiconductor layer 110 by performing mesa etching of a light receiving structure 110, 120 and 130. Further, a second electrode 130a may be disposed on the third semiconductor layer 130.

The semiconductor device 100B shown in FIG. 2 has the horizontal bonding structure and, thus, light from the outside is incident upon a depletion region D through the second electrode 130a and the third semiconductor layer 130.

Further, photons of the incident light may be absorbed by the depletion region D formed between the first semiconductor layer 110 and the second semiconductor layer 120, in the second semiconductor layer 120, and between the second semiconductor layer 120 and the third semiconductor layer 130.

In order to reflect light which is not absorbed by the depletion region D and is transmitted through the depletion region D, the reflective layer 150 may be disposed under the substrate 105.

Figure 3:
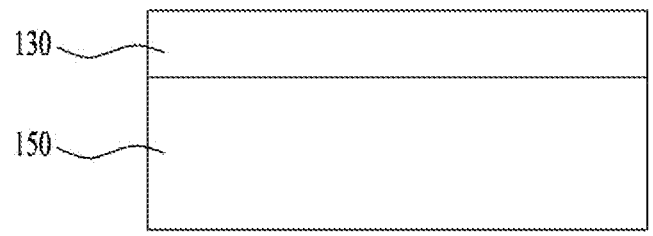
FIG. 3 is a view illustrating a reflective layer in accordance with one embodiment.

FIG. 3 is a view illustrating a reflective layer in accordance with one embodiment.

As exemplarily shown in FIG. 3, the reflective layer 150 may be formed as a film type coated on the third semiconductor layer 130, and the type or method of the reflective layer 150 formed on the third semiconductor layer 130 is not limited thereto.

Further, the reflective layer 150 may include at least one selected from the group consisting of aluminum (Al), rhodium (Rh), silver (Ag), nickel (Ni) and titanium (Ti), or an alloy thereof, without being limited thereto, and include any material having high reflectivity.

Figure 4:
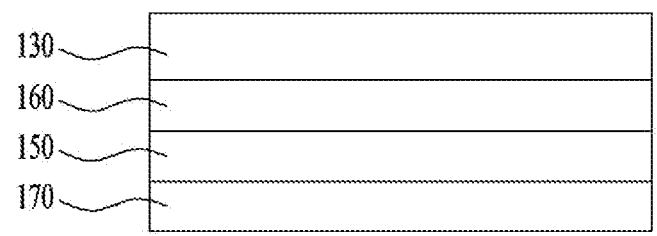
FIGS. 4 to 6 are views illustrating reflective layers in accordance with other embodiments, respectively.

FIG. 4 is a view illustrating a reflective layer in accordance with another embodiment.

With reference to FIG. 4, a semiconductor device in accordance with the embodiment may further include an ohmic layer 160 disposed between a third semiconductor layer 130 and a reflective layer 150.

If the reflective layer 150 is formed of rhodium (Rh) or an alloy of aluminum (Al) and rhodium (Rh), ohmic resistance thereof with the third semiconductor layer 130 may be lower and reflectivity of light incident upon the light emitting device by the reflective layer 150 may be excellent.

However, if the reflective layer 150 is formed of aluminum (Al), ohmic resistance thereof with the third semiconductor layer 130 is high and thus a separate ohmic layer may be required.

The ohmic layer 160 may include one or more selected from the group consisting of rhodium (Rh), nickel (Ni), palladium (Pd), platinum (Pt), titanium (Ti), aluminum (Al) and chromium (Cr).

Although the ohmic layer and the reflective layer may be integrally formed as a single layer, as exemplarily shown in FIG. 3, the ohmic layer 160 and the reflective layer 150 may be respectively disposed on the third semiconductor layer 130, as exemplarily shown in FIG. 4.

The semiconductor device in accordance with the embodiment may further include a protective layer 170 disposed under the reflective layer 150.

The protective layer 170 may serve to secure thermal stability of the reflective layer 150 during a thermal treatment process for forming the ohmic layer 160. Therefore, if the reflective layer 150 is formed of a material having excellent heat resistance, the protective layer 170 may be omitted.

As exemplarily shown in FIG. 4, the ohmic layer 160, the reflective layer 150 and the protective layer 170 may be sequentially disposed on the third semiconductor layer 130 of the semiconductor device in accordance with the embodiment, without being limited thereto, and the ohmic layer 160 and the protective layer 170 may be omitted as circumstances require.

Figure 5:
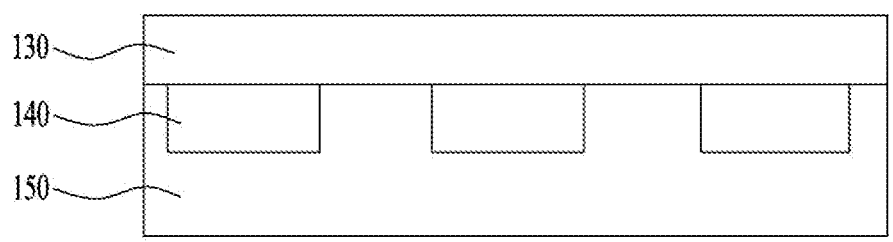

FIG. 5 is a view illustrating a reflective layer in accordance with another embodiment.

With reference to FIG. 5, a semiconductor device in accordance with the embodiment may further include a plurality of fourth semiconductor layers 140 disposed under a third semiconductor layer 130 so as to be spaced apart from one another.

Here, the fourth semiconductor layers 140 may have the same conductivity type as the third semiconductor layer 130, and the fourth semiconductor layers 140 may include a p-GaN layer.

Since ohmic resistance between the third semiconductor layer 130 and a reflective layer 150 is high, the fourth semiconductor layers 140 having low ohmic resistance may be disposed between the third semiconductor layer 130 and the reflective layer 150.

If a thin film for the fourth semiconductor layers 140 is formed on the surface of the third semiconductor layer 130, the fourth semiconductor layers 140 may be formed on the third semiconductor layer 130 through dry etching or selective area growth of the thin film for the fourth semiconductor layers 140.

If the area of the fourth semiconductor layers 140 formed on the third semiconductor layer 130 becomes greater than the area of the third semiconductor layer 130, resistance may be decreased but, if the total area of the fourth semiconductor layers 140 formed on the third semiconductor layer 130 becomes excessively greater than the area of the third semiconductor layer 130, the fourth semiconductor layers 140 may absorb or lose light, and, thus, the area of the fourth semiconductor layers 140 may be properly adjusted according to the area of the third semiconductor layer 130.

When the fourth semiconductor layers 140 are disposed on the third semiconductor layer 130 so as to be spaced apart from one another, the reflective layer 150 may be connected to the semiconductor layer 130 through spaces between the fourth semiconductor layers 140.

Figure 6:
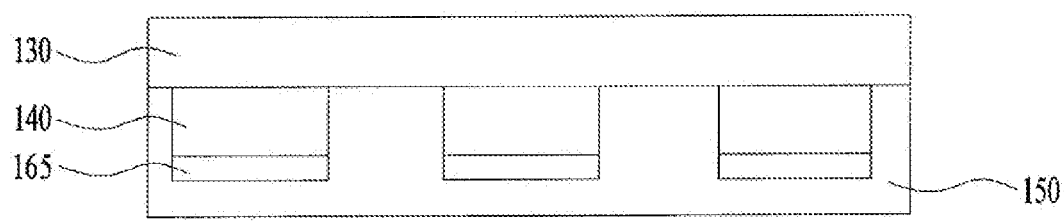

FIG. 6 is a view illustrating a reflective layer in accordance with yet another embodiment.

With reference to FIG. 6, a semiconductor device in accordance with the embodiment may further include a plurality of fourth semiconductor layers 140 disposed under a third semiconductor layer 130 so as to be spaced apart from one another, in the same manner as the semiconductor device in accordance with the embodiment shown in FIG. 5.

The fourth semiconductor layers 140 may be disposed in a designated pattern under the third semiconductor layer 130, and a second ohmic layer 165 may be disposed under the fourth semiconductor layers 140.

The second ohmic layer 165 may include one or more selected from the group consisting of rhodium (Rh), nickel (Ni), palladium (Pd), platinum (Pt), titanium (Ti), aluminum (Al) and chromium (Cr), without being limited thereto.

Further, a reflective layer 150 may be disposed on the fourth semiconductor layers 140 so as to cover the second ohmic layer 165.

The reflective layer 150 may include at least one selected from the group consisting of aluminum (Al), rhodium (Rh), silver (Ag), nickel (Ni) and titanium (Ti), or an alloy thereof, and the reflective layer 150 may be connected to the semiconductor layer 130 through spaces between the fourth semiconductor layers 140.

The reflective layer 150 may be formed of the same material as the second ohmic layer 165 or be formed of a different material from the second ohmic layer 165.

As described above, among light incident upon the semiconductor device 100A, beams, which are not absorbed by the depletion region D via the substrate 105, the buffer layer 115 and the first semiconductor layer 110 and reach the third semiconductor layer 130, are reflected by the reflective layer 150 disposed on the third semiconductor layer 130, or, among light incident upon the semiconductor device 100B, beams, which are not absorbed by the depletion region D via the second electrode 130a and the third semiconductor layer 130 and are transmitted through the first semiconductor layer 110, the buffer layer 115 and the substrate 105, are reflected by the reflective layer 150 disposed on the substrate 105, and, thereby, an amount of photons of light which may be absorbed by the depletion region D may be increased and thus light conversion efficiencies of the semiconductor devices 100A and 100B may be improved.

Although embodiments have been described with reference to a number of illustrative embodiments thereof, it should be understood that numerous other modifications and embodiments can be devised by those skilled in the art that will fall within the spirit and scope of the principles of the disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Semiconductor devices in accordance with embodiments may have improved luminous efficacy.

The invention claimed is:

1. A semiconductor device comprising:
a substrate;
a first semiconductor layer disposed on the substrate;
a second semiconductor layer disposed on the first semiconductor layer;
a third semiconductor layer disposed on the second semiconductor layer; and
a reflective layer disposed on the third semiconductor layer,
wherein:
a part between the first and second semiconductor layers, a part between the third and second semiconductor layers, and the second semiconductor layer comprise a depletion region; and
a conductivity type of the first semiconductor layer and a conductivity type of the third semiconductor layer are different from each other, and the second semiconductor layer comprises an intrinsic semiconductor layer.

2. The semiconductor device according to claim 1, further comprising an ohmic layer disposed between the third semiconductor layer and the reflective layer.

3. The semiconductor device according to claim 2, wherein the ohmic layer and the reflective layer are integrally formed as a single layer.

4. The semiconductor device according to claim 1, further comprising a protective layer disposed on the reflective layer.

5. The semiconductor device according to claim 1, further comprising a plurality of fourth semiconductor layers disposed on the third semiconductor layer so as to be spaced apart from one another.

6. The semiconductor device according to claim 5, wherein the fourth semiconductor layers have the same conductivity type as that of the third semiconductor layer.

7. The semiconductor device according to claim 5, wherein the reflective layer is connected to the third semiconductor layer through spaces between the fourth semiconductor layers.

8. The semiconductor device according to claim 5, further comprising a second ohmic layer disposed on the fourth semiconductor layers.

9. The semiconductor device according to claim 8, wherein the reflective layer is disposed on the fourth semiconductor layers so as to cover the second ohmic layer.

10. The semiconductor device according to claim 2, wherein the ohmic layer comprises one or more selected from the group consisting of rhodium (Rh), nickel (Ni), palladium (Pd), platinum (Pt), titanium (Ti), aluminum (Al) and chromium (Cr).

11. The semiconductor device according to claim 1, wherein the reflective layer comprises one or more selected from the group consisting of aluminum (Al), rhodium (Rh), silver (Ag), nickel (Ni) and titanium (Ti), or an alloy thereof.

12. The semiconductor device according to claim 8, wherein the reflective layer is formed of the same material as the second ohmic layer.

13. The semiconductor device according to claim 8, wherein the reflective layer is formed of a different from the second ohmic layer.

14. The semiconductor device according to claim 2, wherein the first semiconductor layer is an n-type, and the third semiconductor layer is a p-type.

15. The semiconductor device according to claim 2, wherein the first semiconductor layer is a p-type, and the third semiconductor layer is an n-type.

16. The semiconductor device according to claim 1, wherein the reflective layer is formed as a coated film.

17. A semiconductor device comprising:
a substrate;
a first semiconductor layer disposed on the substrate;
a second semiconductor layer disposed on the first semiconductor layer;
a third semiconductor layer disposed on the second semiconductor layer;
a reflective layer disposed on the third semiconductor layer;
a plurality of fourth semiconductor layers disposed on the third semiconductor layer so as to be spaced apart from one another;
an ohmic layer disposed between the third semiconductor layer and the reflective layer; and
a second ohmic layer disposed on the fourth semiconductor layers,
wherein a part between the first and second semiconductor layers, a part between the third and second semiconductor layers, and the second semiconductor layer comprise a depletion region.

18. The semiconductor device according to claim 17, wherein a conductivity type of the first semiconductor layer and a conductivity type of the third semiconductor layer are different from each other.

19. The semiconductor device according to claim 17, wherein the ohmic layer and the reflective layer are integrally formed as a single layer.

20. The semiconductor device according to claim 17, wherein the reflective layer comprises one or more selected from the group consisting of aluminum (Al), rhodium (Rh), silver (Ag), nickel (Ni) and titanium (Ti), or an alloy thereof, and the ohmic layer comprises one or more selected from the group consisting of rhodium (Rh), nickel (Ni), palladium (Pd), platinum (Pt), titanium (Ti), aluminum (Al) and chromium (Cr).

* * * * *